(12) United States Patent
Kolis et al.

(10) Patent No.: US 7,540,917 B2
(45) Date of Patent: Jun. 2, 2009

(54) HYDROTHERMAL GROWTH OF RHOMBOHEDRAL POTASSIUM FLUOROBERYLLIUM BORATE CRYSTALS FOR USE IN LASER AND NON-LINEAR OPTICAL APPLICATIONS AND DEVICES

(75) Inventors: Joseph W Kolis, Central, SC (US);
Colin D. McMillen, Clemson, SC (US);
Henry G. Giesber, III, Charlotte, NC (US)

(73) Assignee: Clemson University, Clemson, SC (US)

( * ) Notice: Subject to any disclaimer, the term of this patent is extended or adjusted under 35 U.S.C. 154(b) by 214 days.

(21) Appl. No.: 11/633,260

(22) Filed: Dec. 4, 2006

(65) Prior Publication Data

US 2007/0157872 A1 Jul. 12, 2007

Related U.S. Application Data

(60) Provisional application No. 60/741,595, filed on Dec. 2, 2005.

(51) Int. Cl.
*C03B 7/10* (2006.01)
(52) U.S. Cl. .............................. 117/70; 117/71; 117/72; 117/73
(58) Field of Classification Search ................... 117/70, 117/71, 72, 73
See application file for complete search history.

(56) References Cited

OTHER PUBLICATIONS

Batsanova, L.R., et al., Dokl. Akad. Nauk SSSR, 1968, 178, 1317-1319.
Soloveva, L.P. and Bakakin, V.V., Kristallografiya, 1970, 15, 922-925.
Cheng, W-D., et al., J. Chem. Soc. Faraday Trans. 1996, 92, 5073-5079.
Lin, Z., et al., Chem. Phys. Lett. 2003, 367, 523-527.
Mei, L., et al., J. App. Phys. 1993, 74, 7014-7015.
Chen, C., et al., Appl. Phys. B, 2005, 80, 1-25.
Chen, C., Opt. Mater. 2004, 26, 425-429.
Mei, L., et al., Z. Kristallog. 1995, 210, 93-95.
Mei, L., et al., J. Cryst. Growth, 1993, 132, 609-610.
Chen, C., et al., J. Appl. Phys. 1995, 77, 2268-2272.
D. Tang, et al., J. Cryst. Growth, 2001, 222, 125-129.
Chen, C., et al., Appl. Phys. Lett. 1996, 68, 2930-2932.
Chen, C., et al., Opt. Lett. 2002, 27, 637-639.
Togashi, T., et al., Opt. Lett. 2003, 28, 254-256.
Wang, G., et al., Appl. Opt. 2003, 42, 4331-4334.
Sasaki, T., et al., Mat. Sci. Eng. 2000, 30, 1-54.
Kanai, T., et al., J. Opt. Soc. Am. B, 2004, 21, 370-375.
Ye, N. and Tang, D., J. Cryst. Growth, 2006, 293, 233-235.
Wu, B., et. al, Opt. Mater. 1996, 5, 105-109.
Wang, G-L., et. al, Chin. Phys. Lett., 2003, 20, 243-245.
Keszler, D.A., Curr. Opin. Sol. State Mater. Sci. 1996, 1, 204-208.
Becker, P., Adv. Mater. 1998, 10, 979-992.
Chen, Laser Focus World, Feb. 2004, 91-93, 95.

*Primary Examiner*—Robert M Kunemund
(74) *Attorney, Agent, or Firm*—Leigh P Gregory

(57) ABSTRACT

Single, acentric, rhombohedral, potassium fluoroberyllium borate crystals of a size sufficient for use in a variety of laser and non-optical applications are formed by a hydrothermal method.

14 Claims, 3 Drawing Sheets

HYDROTHERMAL GROWTH OF RHOMBOHEDRAL POTASSIUM FLUOROBERYLLIUM BORATE CRYSTALS FOR USE IN LASER AND NON-LINEAR OPTICAL APPLICATIONS AND DEVICES

CROSS-REFERENCE TO RELATED APPLICATIONS

The present application claims the benefit of prior provisional application Ser. No. 60/741,595, filed Dec. 2, 2005.

FIELD OF THE INVENTION

The present invention is directed to rhombohedral potassium fluoroberyllium borate crystals having the formula $KBe_2BO_3F_2$ (KBBF) made by a hydrothermal method for a wide variety of end-use applications. Specifically, when made by the present hydrothermal method, single crystals of a size sufficient for use in a variety of optical applications are readily formed.

BACKGROUND OF THE INVENTION

It is well known that there is a steadily increasing demand for higher performance materials in optical applications. In many cases, these materials must be high quality single crystals of a size sufficiently large so that they are capable of being cut, shaped and polished into pieces several millimeters on a side. This is particularly true for solid state optical devices such as all solid state lasers and optical switching devices. For example, there has recently been a rapidly expanding application of new crystals finding use in diode pumped sold state lasers.

More specifically, there is a rapidly increasing demand for lasers capable of generating coherent radiation in the violet and ultraviolet region of the optical spectrum. In general these shorter wavelengths of coherent radiation have many useful properties. Shorter wavelength leads to greater resolution in applications such as lithography, micromachining, patterning labeling, information storage and related applications. In addition a convenient source of UV radiation would lead to significant advances in spectroscopy, biological applications and sensor technology. At present there are very few methods available for the generation of coherent laser radiation at wavelengths between 150 and 350 nm. The most common techniques rely on excimer lasers based on gases like krypton fluoride or fluorine, capable of generating 193 nm and 157 nm laser radiation respectively. However, these lasers require the use of corrosive gases. As such they are large, bulky, unreliable and restricted to a few specific wavelengths. Diode lasers that emit in the UV are the subject of intense research and, although showing some promise, are plagued by short lifetimes, low power and generally limited performance.

An attractive and simple alternative for UV lasers is the generation of short wavelength laser radiation by multiple harmonic generation of readily available longer wavelength laser sources using non-linear optical frequency multiplying crystals. Such an approach is typified in the visible region by the generation of 532 nm coherent radiation by the second harmonic generation of 1064 nm emission generated by conventional Nd:YAG, Nd:YVO$_4$ or related sources. In the case of 532 nm radiation, the non-linear optical crystal used for the frequency doubling is most typically $K(TiO)(PO_4)$ (KTP). The process generally can be used to generate relatively high powers, and uses solid crystals making the devices very reliable, compact and long lasting.

Frequency doubling is a non-linear optical process that combines two photons of one wavelength to produce a new photon of one half the wavelength. Thus it is energy neutral. The process is not notably efficient but requires only passive optical components. The checklist of requirements for a successful second harmonic generation crystal is well understood. The crystal must grow in a space group having no center of symmetry and be a member of an acentric point group in a uniaxial or biaxial lattice type (rhombohedral, hexagonal, tetragonal, trigonal, orthorhombic or monoclinic) with a satisfactory non-linear optical (NLO) coefficient. In addition, the crystal must have moderate birefringence for phase matching, and must be transparent and optically stable to both the excitation and generated wavelengths. The crystal must have good physical properties, be thermally stable, hard enough to fabricate and polish and be mechanically stable and non-hygroscopic.

Most importantly, the crystal must be able to be produced in high quality in suitable size (typically several millimeters per side or larger) for optoelectronic applications. For generation of light in the visible region and the near IR, several excellent crystals exist that fulfill these requirements, including KTP, KTA, $LiNbO_3$ and $KNbO_3$, However, none of these are suitable for generation of near UV, UV or deep UV radiation as their band gaps are not large enough, so they absorb all of the resultant second harmonic radiation. In the past two decades, several new crystals have been introduced to fulfill the minimum requirements described above. They are typically borates with band gaps sufficiently large to allow for the generation of limited UV wavelengths. Borates are especially attractive because they often have band gaps that are sufficiently wide to accommodate UV radiation and tend to crystallize in acentric space groups. The most common of these is $\beta\text{-}BaB_2O_4$ (BBO) that is typically used for the generation of 266 mm radiation through the frequency doubling of 532 nm radiation. Several other crystals with unique structures have also been introduced recently including $LiB_3O_5$ (LBO) and $CsLiB_6O_{10}$ (CLBO). All these materials have some commercial availability.

Although these materials do crystallize in acentric space groups and have sufficiently wide absorption band gaps to allow formation of radiation in part of the UV spectrum, they all have considerable limitations. For example BBO has an insufficiently wide band gap to allow generation of radiation with wavelengths shorter than 220 nm. In particular the presence of a $B_3O_6$ ring in the crystal lattice leads to the presence of a band gap that not large enough for frequency mixing below 200 nm. The other crystals currently used for non-linear optical applications in the UV are LBO and CLBO. Both of these also have severe limitations. In particular, LBO has an extremely low NLO coefficient and does not phase-match well, while CLBO is very hygroscopic. There are numerous other crystals, typically borates that have been reported as growing in acentric space groups and having suitable wide band gaps for UV radiation. However, they almost all have insufficient birefringence to allow for phase matching. The inability to phase-match is an important limitation that renders these otherwise promising crystals useless for any practical NLO related applications. Thus there is considerable demand for new crystals that can meet the criteria for second harmonic generation over a reasonably wide range of the UV spectrum.

In the last decade two new berylloborates with the formulas $KBe_2BO_3F_2$ (KBBF) and $Sr_2Be_2B_2O_7$ (SBBO), were reported that seem to fulfill most of the necessary requirements. They have band gaps near 155 nm and grow in appropriate acentric space groups. Most importantly they seem to have moderate birefringence and appear capable of phase matching over a fairly wide range below 220 nm. Thus they seem like very promising candidates for generation of a wide range of UV and deep UV laser radiation using well-understood solid-state technology. Preliminary reports suggest that both materials KBBF and SBBO have properties that make them suitable for numerous applications requiring non-linear optical behavior.

However, there has been a serious limitation to the practical introduction of the KBBF in any of the above applications. All of the applications described herein require high quality single crystals of a certain size, typically 3-5 millimeters after cutting and polishing. Thus any useful application requires raw product in the form of single crystals at least one centimeter per edge. For commercial production, the size must be at least several centimeters per edge. These same formulas in the form of microcrystals, powders or small, low quality crystals are essentially worthless for optoelectronic applications. Only large, high quality crystals provide material with any technical use. This is particularly true for solid state optical devices such as all solid state lasers and optical switching devices.

Heretofore, the growth of KBBF crystals has been extremely problematic. Specifically, it has been grown out of molten fluxes and the growth method has not proven to be reproducible or suitable for crystals of sufficient quality for any optical application. This dramatic shortcoming has prevented the introduction of KBBF into any prototype device and has even limited the further measurement of the physical properties of the materials. Despite repeated attempts by the original authors they report that they have been unable to produce satisfactory single crystals using any flux technology. The products are always too small, cracked, flaky and generally poor quality for any conceivable optical application. In addition, KBBF is negatively affected by the fact that the material has a strong natural tendency to form crystals with extremely layered or "micaceous" habit. They form crystals with layers that are easily peeled and highly disordered like mica. This habit is debilitating to the use of the material in optoelectronic applications because the material cannot be cut and processed adequately nor grown as single crystals of suitably high quality.

Hydrothermal techniques are an excellent route to high quality single crystals for electro-optic applications. For example, all electronic grade quartz is grown commercially by the hydrothermal method. Further, KTP is grown by both flux and hydrothermal methods, and it is widely acknowledged by those skilled in the art that the hydrothermally grown product is of generally superior quality. The hydrothermal method involves the use of superheated water (liquid water heated above its boiling point) under pressure to cause transport of soluble species from a nutrient rich zone to a supersaturated growth zone. Generally a seed crystal is placed in the growth zone. The growth and supersaturation control is achieved by the use of differential temperature gradients. The superheated fluid is generally contained under pressure, typically 5-30 kpsi, in a metal autoclave. Depending on the chemical demands of the system the autoclave can be lined with a nobel metal using a either fixed or floating liner. These general techniques are well known in the art and have been used for the growth of a variety of other electro-optic crystals.

SUMMARY OF THE INVENTION

Accordingly, the present invention is directed to $KBe_2BO_3F_2$ (KBBF) in the form of large single crystals made by a hydrothermal crystal growth process. The crystals are of sufficient size and quality to be cut, polished and coated for optical applications. The crystals form in the R32 space group, have uniaxial acentric structures and wide band gaps (<200 nm). This represents a significant advancement in the field, as these new crystals can be employed directly in a number of solid-state optoelectronic devices such as lasers emitting coherent radiation below 220 nm wavelengths. The technique is a low temperature method compared to existing melt growth methods, with crystals being grown at temperatures generally below 650° C. using hydrothermal methods. The invention disclosed herein allows for production of crystals grown in sufficiently large size as to be able to be cut and oriented so as to be useful for optical and optoelectronic applications. This size is typically in excess of 3-5 mm on any edge. This is more than adequate for the crystals to be cut, polished and oriented for any NLO application.

Thus, the present invention is directed to a method for making rhombohedral fluoroberyllium borate crystals having the formula $KBe_2BO_3F_2$ (KBBF), which includes the steps of providing microcrystalline $KBe_2BO_3F_2$ powder, and recrystallizing the microcrystalline $KBe_2BO_3F_2$ in an aqueous solution at a temperature of from about 300° C. to about 600° C. and at a pressure of from about 8 kpsi to about 40 kpsi, the aqueous solution containing fluoride ions at a concentration of from about 0.01 to about 5 molarity. Although it may be obtained from alternate sources, the microcrystalline $KBe_2BO_3F_2$ powder may be provided by reacting $KBF_4$, BeO, and a borate such as $B_2O_3$ or $H_3BO_3$ in an air atmosphere at a temperature of at least about 700° C. for at least about 1 hour. Preferred conditions for the recrystallization step include a fluoride ions concentration of from about 0.1 to about 1 molarity, a temperature of from about 400° C. to about 550° C., and a pressure of from about 12 kpsi to about 18 kpsi. The present invention is also directed to the crystal made by this process.

Further, the present invention is directed to a method for making rhombohedral fluoroberyllium borate crystals having the formula $KBe_2BO_3F_2$ (KBBF), which includes the steps of reacting $KBF_4$, BeO, and a borate such as $B_2O_3$ or $H_3BO_3$ in an aqueous solution at a temperature of from about 300° C. to about 600° C. and at a pressure of from about 8 kpsi to about 40 kpsi, wherein the aqueous solution contains fluoride ions at a concentration of from about 0.01 to about 5 molarity. Preferably, the fluoride ions are present in the aqueous solution at a concentration of from about 0.25 to about 1 molarity, the temperature ranges from about 450° C. to about 550° C., and the pressure ranges from about 12 kpsi to about 18 kpsi. The present invention is also directed to the crystal made by this process.

Additionally, the present invention is directed to a method for making rhombohedral fluoroberyllium borate crystals having the formula $KBe_2BO_3F_2$ (KBBF), which includes the steps of providing a pressure vessel having a growth region and a nutrient region, providing a seed crystal having the formula $KBe_2BO_3F_2$, positioning the seed crystal in the growth region of the pressure vessel, providing a medium containing a nutrient and a mineralizer in the nutrient region, wherein the nutrient is powdered or microcrystalline $KBe_2BO_3F_2$, and the mineralizer is fluoride ions, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 300° C. to about 450° C., the nutrient temperature ranging from about 450° C. to about 600° C., the nutrient temperature being higher than the growth temperature and the pressure ranging from about 8 kpsi to about 40 kpsi. Preferably, the fluoride ions are present in the medium at a concentration of from about 0.01 to about 5 molarity, the growth temperature ranges from about 375° C. to about 525° C., the nutrient temperature ranges from about 475° C. to about 525° C., and the pressure ranges from about 12 kpsi to about 18 kpsi. The present invention is also directed to the crystal made by this process.

Furthermore, the present invention is directed to a single acentric, rhombohedral, fluoroberyllium borate crystal having the formula $KBe_2BO_3F_2$, belonging to the R32 space group and 32 point group and having a dimension of at least 2 mm in at least one direction, and which exhibits non-linear optical properties.

BRIEF DESCRIPTION OF THE FIGURES OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

DETAILED DESCRIPTION OF THE PREFERRED EMBODIMENTS

Figure 1:
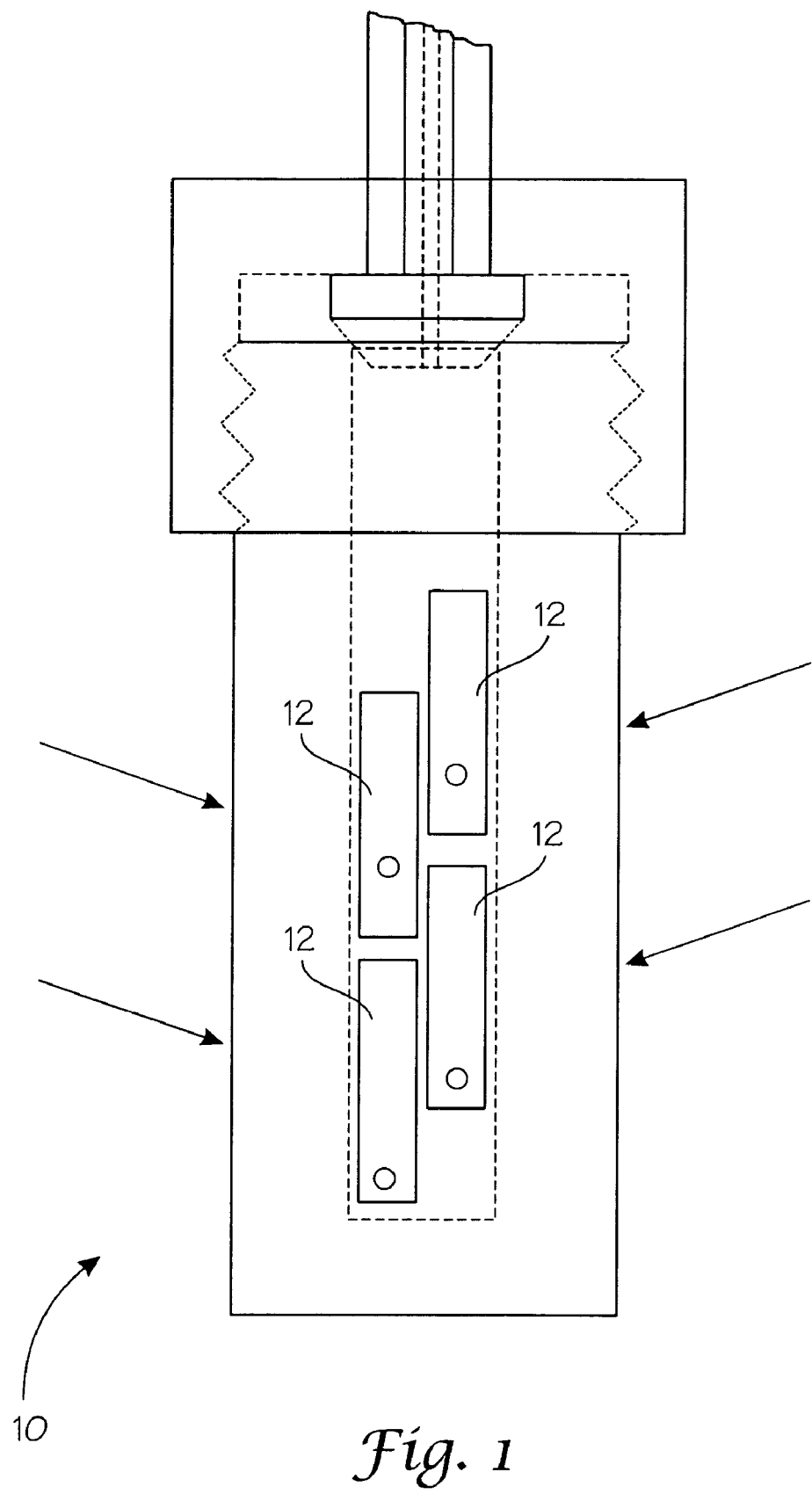
FIG. 1 schematically illustrates an autoclave loaded for crystal growth under hydrothermal conditions.

The present invention is directed to a process to grow single crystals of $KBe_2BO_3F_2$ (KBBF) which are of sufficient size and quality to be cut into crystals for use in solid state lasers and optical switches (generally, equal or greater than 2 mm per side). This method involves growth at temperatures between 300 and 600° C. and pressures between 8000 and 40,000 psi. The process is unique in that it provides a useful, technologically applicable method to grow crystals of sufficient size for use in laser and optoelectronic devices. Specifically, large single crystals are grown in hydrothermal solutions above 300° C. and the materials have a positive solubility coefficient allowing transport from a hotter feedstock zone to a relatively cooler growth zone.

The hydrothermal method involves water heated under pressure to temperatures substantially higher than its boiling point. Typically, optimum crystal growth conditions require a positive solubility coefficient of the desired crystal, an appropriate mineralizer and temperatures between 300 and 600° C. It allows growth of single crystals of a size sufficient to cut polished, coated and aligned for used in applications (at least 2 millimeters on an edge for finished product). For KBBF, the mineralizer can be some source of fluoride ion such as KF, RbF, CsF or related fluorides. Alternatively, the mineralizer can be other salts that act as a source of small soluble ions with a negative charge such as $OH^-$, $Cl^-$, $CO_3^{2-}$, $HCO_3^-$, $H_2BO_3^-$, $NO_3^-$ and other similar ions. KBBF also can be transported and grown using pure water or mild or weak acids such as dilute HCl, HBr, $HNO_3$, $H_3BO_3$ and other mild acids.

The present inventive process can lead to production of large crystals of a size that is only limited by the size of the growth chamber and the time of growth. Thus, crystals as large as 10 centimeters on an edge can be grown. In addition, the quality of the crystals is very high and can be cut, polished and aligned to perform a wide variety of optoelectronic functions requiring acentric, birefringent crystals with an optical transparency near 150 nm, of a desired size. The process is novel in that it employs a new type of route to single crystals of materials that can be used in short wavelength NLO applications.

In accordance with the present invention, high quality KBBF crystals may be formed by one of three possible hydrothermal methods. By the first method a microcrystalline powder of the desired composition is recrystallized under hydrothermal conditions. Thus, the recrystallization occurs in an aqueous solution at a temperature of from about 300° C. to about 600° C., at a pressure of from about 8 kpsi to about 40 kpsi, and at a fluoride concentration of from about 0.01 to about 5 molarity. Preferred conditions are a temperature of from about 400° C. to about 550° C., a fluoride concentration of from about 0.1 to about 1 molar, and a pressure of from about 12 to 18 kpsi. Although it may be obtained from other sources the microcrystalline powder may be made by reacting $KBF_4$, BeO, and a borate such as $B_2O_3$ or $H_3BO_3$, in an air atmosphere at a temperature of at least about 700° C. for at least about 1 hour.

By the less preferred method of spontaneous nucleation the crystal may be formed and grown from the reactants in one step. Thus, $KBF_4$, BeO, and a borate such as $B_2O_3$ or $H_3BO_3$, are reacted in an aqueous solution at a temperature of from about 300° C. to about 600° C. and at a pressure of from about 8 kpsi to about 40 kpsi, the aqueous solution further containing fluoride ions at a concentration of from about 0.01 to about 5 molarity. Preferred conditions are a temperature of from about 450° C. to about 550° C., a fluoride concentration of from about 0.25 to about 1 molar, and a pressure of from about 12 to 18 kpsi. The crystals formed by spontaneous nucleation are generally between 0.5 and 5 millimeters on and edge and are often polynuclear and of insufficient quality for device application. However, these crystals can often be used as seeds for hydrothermal transport growth to obtain larger crystals as in the preferred embodiment described below.

FIG. 1 schematically represents a preferred autoclave 10 employed in achieving the temperature and pressure conditions necessary for the present reaction. The reactants are added to a silver tube 12 having a diameter of 0.25 in and a length of 2 in. Then, the fluoride source is added to the tube and it is welded shut. The sealed tube or ampoule is placed in the autoclave which has an internal diameter of ½ in and a depth of 6 in. Water is added to the autoclave, filling approximately 75% of the remaining free volume of the autoclave. The autoclave is sealed shut using a cold seal. The sealed autoclave containing the sealed silver ampoule is placed in a tube furnace oriented in a vertical position. The furnace is heated to the desired elevated temperature and held at that temperature for an extended period of time. The water in the autoclave expands at this elevated temperature to create the desired elevated pressure. The top of the autoclave extends upwardly above the furnace so it is not heated as high as the main body of the autoclave (thus the term "cold seal"). This relatively cooler area creates a natural temperature gradient allowing spontaneous growth of reasonable sized single crystals. Thereafter, the autoclave is removed from the oven and cooled in a stream of air.

More preferred is the transport growth method whereby seed crystals are positioned in a growth region of a pressure vessel, and a medium which contains a nutrient and a mineralizer are provided in a nutrient region of the vessel. The seed crystals are small KBBF crystals, the nutrient is powdered or microcrystalline KBBF, and the mineralizer is, preferably, fluoride ions. The vessel is heated and pressurized such that a growth temperature is produced in the growth region, a nutrient temperature is produced in the nutrient region, and a temperature gradient is produced between the growth region and the nutrient region such that growth of the crystal is initiated. The growth temperature ranges from about 300° C. to about 525° C., the nutrient temperature ranges from about 450° C. to about 600° C., with the nutrient temperature always being higher than the growth temperature. The pressure ranging from about 8 kpsi to about 40 kpsi. The fluoride ion concentration preferably ranges from about 0.01 to about 5 molarity. Preferred conditions are a growth temperature of from about 375° C. to about 425° C., a nutrient temperature ranges from about 475° C. to about 525° C., and a pressure of from about 12 kpsi to about 18 kpsi. By the present transport growth method the thermal gradient induces transport because 1) it causes supersaturation at the seed in the "cool" zone leading to precipitation and 2) the thermal gradients induce the formation of convection currents leading to mass transfer from the feedstock to growth zone. Thus, the small seed crystals ripen and increase in size and eventually become sufficiently large to be useful in optical applications.

Figure 2:
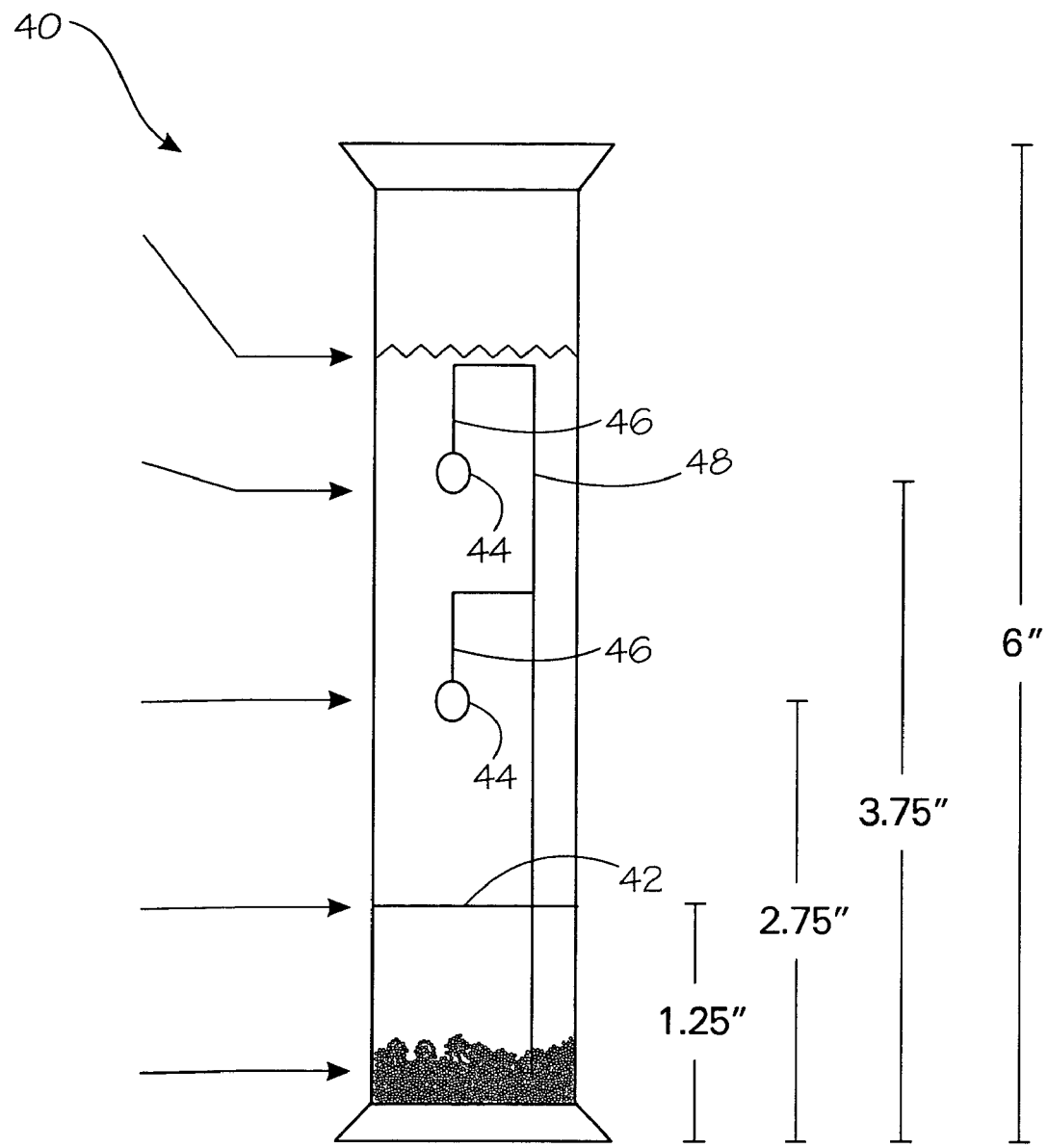
FIG. 2 schematically illustrates a representative silver tube with seed crystals suspended from a ladder for the growth of larger crystals in accordance with one method of the present invention, specifically a transport growth technique.

Specifically, the apparatus for performing the hydrothermal growth transport method is shown in FIG. 2 which shows silver tube 20, preferably of dimensions ⅜ in by 6 in. Specific dimensions are shown in FIG. 2 in order to clarify relative dimensions. It is to be understood that tubes of varying sizes may be and are employed. However, for the specific apparatus of FIG. 2, a silver baffle 22 with three or more small holes in it is placed 1.25 inches above the bottom of the tube. Two single crystals 24 of KBBF, each approximately 2×2×4 mm, serve as seeds. Holes are drilled in the crystals and they are hung by silver thread 26 on a small silver ladder 28 placed within the tube. The two seed crystals are hung 2.75 inches and 3.75 inches above the bottom of the tube, respectively. Preferably, the aqueous fluoride solution is added to the tube and fills about 80% of the remaining volume of the tube. The tube is welded shut and placed in an autoclave with a cold seal and a ½ in by 8 in opening. An amount of water sufficient to occupy 80% of the remaining free volume is added and the autoclave sealed and placed in an upright tube furnace. The autoclave is heated with a temperature gradient. After an extended period of time, the autoclave is cooled, opened and the silver tube opened.

Growths are typically performed in autoclaves capable of containing the high temperatures and pressures, usually constructed of a nickel-based alloy such as Inconel or Rene 41. The containers typically contain nobel metal liners of either the floating or fixed variety.

Figure 3:
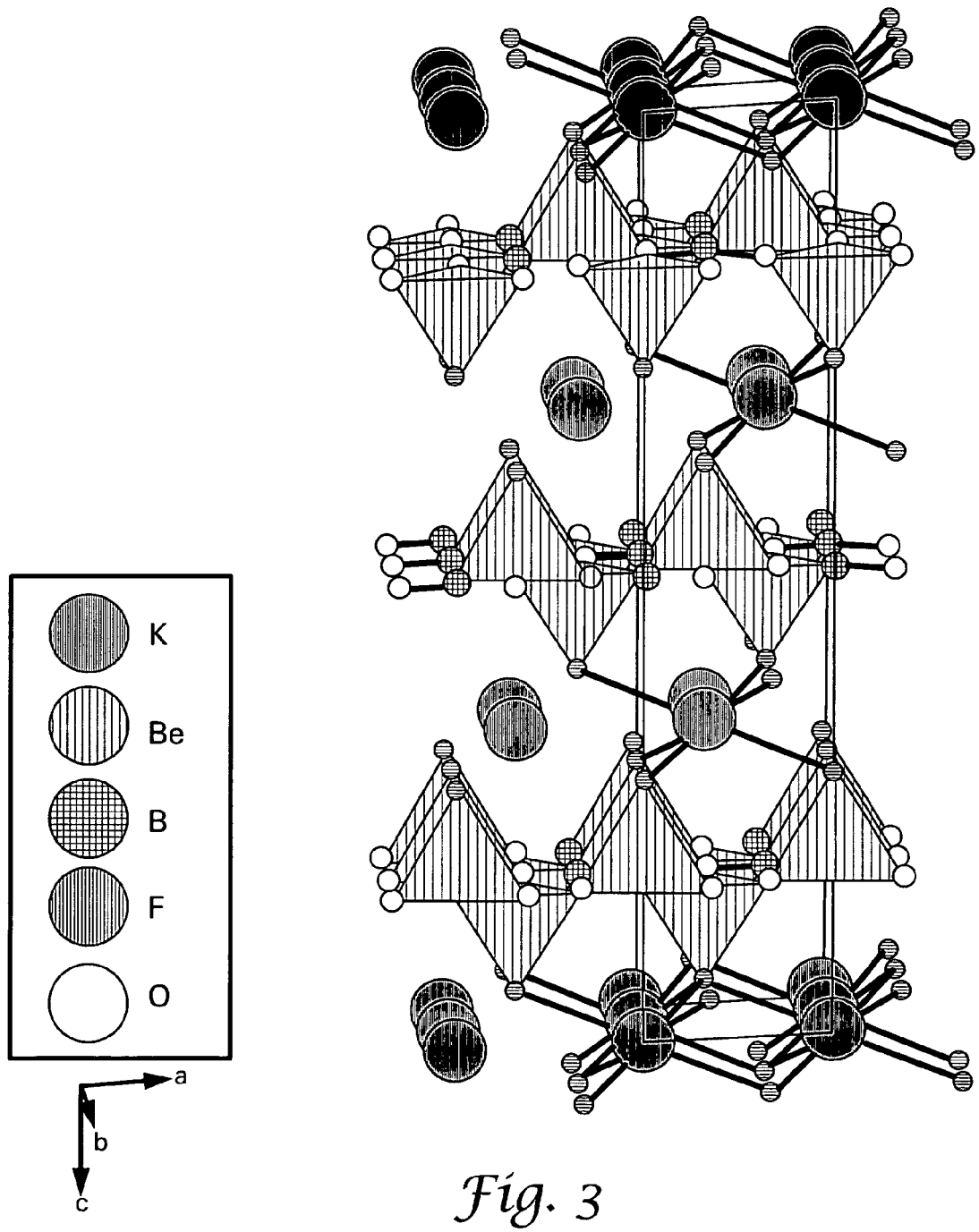
FIG. 3 illustrates the crystal structure of a KBBF crystal in accordance with the present invention.

As is shown in FIG. 3. KBBF crystals have layered $BO_3$ groups with the terminal oxygen atoms linked to beryllium atoms. The beryllium atoms are tetrahedrally coordinated to three oxygen atoms and one fluoride. It is the planar borates that interact with incoming photons in optical devices that provide the non-linear optical coefficients that make the present crystals useful in optoelectronic applications. The trigonal planar borates and tetrahedral beryllates form connected groups that create an alternating layered structure. The potassium ion, K, is located between the layers and linked to the various fluorides.

Further illustrations of the invention are provided in the Examples, below.

EXAMPLE 1

KBBF crystals were recrystallized from a powdered KBBF starting charge. The KBBF starting powder was prepared by the solid state reaction:

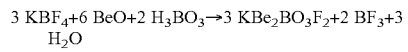

$3\ KBF_4 + 6\ BeO + 2\ H_3BO_3 \rightarrow 3\ KBe_2BO_3F_2 + 2\ BF_3 + 3\ H_2O$ The above materials were ground together and placed in a platinum crucible, then heated at 700° C. for 2 days in an air atmosphere.

KBBF powder from the above reaction was then placed in a platinum, silver or gold ampoule whose bottom has been welded shut. For ¼" ampoules, 0.1 g KBBF and 0.4 mL of 1M KF was employed. Other mineralizers including 1M NaOH, 2M KF and 4M KF were employed in other tests. It was found that 4M KF leads to the formation of $K_2BeF_4$ as a side product. The largest crystals produced by spontaneous nucleation were approximately 4 mm in their greatest dimension. The ampoules were placed in an autoclave and counter pressured with water to prevent the ampoules from bursting (approximately 25 kpsi pressure). The autoclave was sealed and heated (either in a vertical furnace or by ceramic band heaters) to 600° C., and held at temperature for five days. The yields of these reactions using 2M or less $F^-$ concentration were 100% KBBF. Increased concentration lead to gradual production of $K_2BeF_4$ as an impurity.

EXAMPLE 2

KBBF crystals made in accordance with Example 1 were drilled and tied using 0.1 mm diameter platinum wire onto a platinum ladder fashioned from 1 mm diameter wire. When hung, the crystals were 5-6 inches above the level of the feedstock. When using the floating liners, no baffle is included on the ladder apparatus because of the uncertainty already introduced by the ampoule's compression under the counter-pressure of 22 kpsi. A powdered or ground microcrystalline feedstock of the formula KBBF was prepared using transport reaction or a molten flux reaction. Using 1M KF and a thermal gradient with 575° C. hot zone and a 525° C. growth zone for six days, over 200 mg of KBBF was transported to the seed to grow a very high quality single crystal. The dimension of the seed increased by several millimeters on each edge over this time period. Once the equilibrium is reached the transport rates are approximately constant so growth of the single crystal continues as long as the feedstock is present and the thermal gradient is maintained. A larger pressure vessel and longer growth time leads to crystals several centimeters or larger per edge.

Preferred embodiments of the invention have been described using specific terms and devices. The words and terms used are for illustrative purposes only. The words and terms are words and terms of description, rather than of limitation. It is to be understood that changes and variations may be made by those of ordinary skill art without departing from the spirit or scope of the invention, which is set forth in the following claims. In addition it should be understood that aspects of the various embodiments may be interchanged in whole or in part. Therefore, the spirit and scope of the appended claims should not be limited to descriptions and examples herein. Moreover, Applicants hereby disclose all sub-ranges of all ranges disclosed herein. These sub-ranges are also useful in carrying out the present invention.

We claim:

1. A method for making rhombohedral fluoroberyllium borate crystals having the formula $KBe_2BO_3F_2$ (KBBF), comprising the steps of:
   providing microcrystalline $KBe_2BO_3F_2$ powder; and
   recrystallizing the microcrystalline $KBe_2BO_3F_2$ in an aqueous solution at a temperature of from about 300° C. to about 600° C. and at a pressure of from about 8 kpsi to about 40 kpsi, the aqueous solution comprising fluoride ions at a concentration of from about 0.01 to about 5 molarity.

2. The method set forth in claim 1 wherein the step of providing microcrystalline $KBe_2BO_3F_2$ powder comprises reacting $KBF_4$, BeO, and a borate selected from the group consisting of $B_2O_3$ and $H_3BO_3$, in an air atmosphere at a temperature of at least about 700° C for at least about 1 hour.

3. The method set forth in claim 1 wherein the step of recrystallizing the microcrystalline $KBe_2BO_3F_2$ occurs in an aqueous solution containing fluoride ions at a concentration of from about 0.1 to about 1 molarity.

4. The method set forth in claim 1 wherein the step of recrystallizing the microcrystalline $KBe_2BO_3F_2$ occurs in an aqueous solution at a temperature of from about 400° C to about 550° C.

5. The method set forth in claim 1 wherein the step of recrystallizing the microcrystalline $KBe_2BO_3F_2$ occurs in an aqueous solution at a pressure of from about 12 kpsi to about 18 kpsi.

6. A method for making rhombohedral fluoroberyllium borate crystals having the formula $KBe_2BO_3F_2$ (KBBF), comprising the steps of:
   reacting $KBF_4$, BeO, and a borate selected from $B_2O_3$ and $H_3BO_3$, in an aqueous solution at a temperature of from about 300° C to about 600° C and at a pressure of from about 8 kpsi to about 40 kpsi, the aqueous solution further containing fluoride ions at a concentration of from about 0.01 to about 5 molarity.

7. The method set forth in claim 6 wherein the fluoride ions are present in the aqueous solution at a concentration of from about 0.25 to about 1 molarity.

8. The method set forth in claim 6 wherein the temperature ranges from about 450° C. to about 550° C.

9. The method set forth in claim 6 wherein the pressure ranges from about 12 kpsi to about 18 kpsi.

10. A method for making rhombohedral fluoroberyllium borate crystals having the formula $KBe_2BO_3F_2$ (KBBF), comprising the steps of:
    providing a pressure vessel having a growth region and a nutrient region;
    providing a seed crystal having the formula $KBe_2BO_3F_2$;
    positioning the seed crystal in the growth region of the pressure vessel;
    providing a medium comprising a nutrient and a mineralizer in the nutrient region, the nutrient comprising powdered or microcrystalline $KBe_2BO_3F_2$, the mineralizer comprising fluoride ions; and
    heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 300° C. to about 525° C., the nutrient temperature ranging from about 450° C. to about 600° C., the nutrient temperature being hither than the growth temperature and the pressure ranging from about 8 kpsi to about 40 kpsi.

11. The method set forth in claim 10 wherein the fluoride ions are present in the medium at a concentration of from about 0.01 to about 5 molarity.

12. The method set forth in claim 10 wherein the growth temperature ranges from about 375° C. to about 425° C.

13. The method set forth in claim 10 wherein the nutrient temperature ranges from about 475° C. to about 525° C.

14. The method set forth in claim 10 wherein the pressure ranges from about 12 kpsi to about 18 kpsi.

* * * * *

UNITED STATES PATENT AND TRADEMARK OFFICE
CERTIFICATE OF CORRECTION

| | |
|---|---|
| PATENT NO. | : 7,540,917 B2 |
| APPLICATION NO. | : 11/633260 |
| DATED | : June 2, 2009 |
| INVENTOR(S) | : Joseph W. Kolis, Colin D. McMillen and Henry G. Giesber, III |

It is certified that error appears in the above-identified patent and that said Letters Patent is hereby corrected as shown below:

Column 1, line 13 (insert prior to FIELD OF INVENTION) --This invention was made with government support under grant number DMR0305377 awarded by the National Science Foundation. The government has certain rights in the invention.--

Signed and Sealed this
Twelfth Day of March, 2013

Teresa Stanek Rea
*Acting Director of the United States Patent and Trademark Office*